(12) United States Patent
Wang et al.

(10) Patent No.: US 9,625,626 B2
(45) Date of Patent: Apr. 18, 2017

(54) DISPLAY MOTHERBOARD AND MANUFACTURING METHOD THEREOF

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Hui Wang, Beijing (CN); Yuanhui Guo, Beijing (CN); Chun Wang, Beijing (CN); Junsheng Chen, Beijing (CN); Xiaohe Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/130,247

(22) Filed: Apr. 15, 2016

(65) Prior Publication Data
US 2016/0327707 A1    Nov. 10, 2016

(30) Foreign Application Priority Data
May 8, 2015  (CN) .......................... 2015 1 0233172

(51) Int. Cl.
*H01L 21/02* (2006.01)
*H01L 21/66* (2006.01)
(Continued)

(52) U.S. Cl.
CPC ............ *G02B 5/201* (2013.01); *H01L 27/124* (2013.01)

(58) Field of Classification Search
CPC ................. H01L 2223/544–2223/5448; H01L 2224/8012–2224/80123;
(Continued)

(56) References Cited

U.S. PATENT DOCUMENTS

| | | | |
|---|---|---|---|
| 2006/0038581 A1* | 2/2006 | Kanai | G01N 21/95 324/760.01 |
| 2012/0299895 A1* | 11/2012 | Lin | G09G 3/3655 345/211 |

(Continued)

*Primary Examiner* — Raj R Gupta
(74) *Attorney, Agent, or Firm* — Nath, Goldberg & Meyer; Joshua B. Goldberg; Christopher Thomas

(57) ABSTRACT

Embodiments of the present invention disclose a display motherboard and a manufacturing method thereof. The display motherboard includes a plurality of process areas, the process area includes a plurality of display panels and the display panel includes a color filter substrate and an array substrate provided opposite to each other. The technical solution of the present invention first determines the process area, to which the display panel belongs, by the predetermined number for transitional sub-pixels in the part of the non-display area on one side of the display area on the color filter substrate, and then determines the specific position of the display panel in the process area, to which the display panel belongs, by the location identifier on the array substrate, so that the identification for the display panel is realized, which improves capacity of production line while optimizing design space of peripheral area for the display panel.

14 Claims, 9 Drawing Sheets forming a display area and a non-display area on the color filter substrate, the non-display area being provided surrounding the display area, a part of the non-display area at one side of the display area being provided with a predetermined number of transitional sub-pixels, the predetermined number of transitional sub-pixels being used for identifying the process area corresponding to the display panel — 1001 forming a location identifier on the array substrate, the location identifier being used for identifying the position of the display panel in the process area — 1002

(51) Int. Cl.
*H01L 23/544* (2006.01)
*H01L 27/32* (2006.01)
*G02B 5/20* (2006.01)
*H01L 27/12* (2006.01)

(58) Field of Classification Search
CPC .... H01L 2224/80129–2224/8013; H01L 23/544; H01L 27/124
See application file for complete search history.

(56) References Cited

U.S. PATENT DOCUMENTS

| | | | | |
|---|---|---|---|---|
| 2012/0313236 | A1* | 12/2012 | Wakiyama | H01L 23/544 257/734 |
| 2013/0214337 | A1* | 8/2013 | Kashihara | H01L 27/1464 257/294 |
| 2016/0027376 | A1* | 1/2016 | Chen | G09G 3/3208 345/694 |
| 2016/0190087 | A1* | 6/2016 | Yu | H01L 24/75 156/379.6 |
| 2016/0247734 | A1* | 8/2016 | Fukushima | G09G 3/006 |

\* cited by examiner

FIG. 6

| G | B | R | G | B | R | G | B | R | G | B | R | G | B | R | G | B | R | G | B | R |
|---|---|---|---|---|---|---|---|---|---|---|---|---|---|---|---|---|---|---|---|---|
| G | B | R | G | B | R | G | B | R | G | B | R | G | B | R | G | B | R | G | B | R |
| G | B | R | G | B | R | G | B | R | G | B | R | G | B | R | G | B | R | G | B | R |
| G | B | R | G | B | R | G | B | R | G | B | R | G | B | R | G | B | R | G | B | R |
| G | B | R | G | B | R | G | B | R | G | B | R | G | B | R | G | B | R | G | B | R |
| G | B | R | G | B | R | G | B | R | G | B | R | G | B | R | G | B | R | G | B | R |

FIG. 7

|   |   |   |   |   |   |   |   |   |   |   |   |   |   |   |   |   |   |   |   |   |
|---|---|---|---|---|---|---|---|---|---|---|---|---|---|---|---|---|---|---|---|---|
| B | R | G | B | R | G | B | R | G | B | R | G | B | R | G | B | R | G | B | R | G |
| B | R | G | B | R | G | B | R | G | B | R | G | B | R | G | B | R | G | B | R | G |
| B | R | G | B | R | G | B | R | G | B | R | G | B | R | G | B | R | G | B | R | G |
| B | R | G | B | R | G | B | R | G | B | R | G | B | R | G | B | R | G | B | R | G |
| B | R | G | B | R | G | B | R | G | B | R | G | B | R | G | B | R | G | B | R | G |
| B | R | G | B | R | G | B | R | G | B | R | G | B | R | G | B | R | G | B | R | G |

DISPLAY MOTHERBOARD AND MANUFACTURING METHOD THEREOF

CROSS-REFERENCE TO RELATED APPLICATIONS

The present application claims the priority of Chinese Patent Application No. 201510233172.8, filed on May 8, 2015, the contents of which are incorporated herein in their entirety by reference.

FIELD OF THE INVENTION

The present invention relates to the field of display technology, and particularly, to a display motherboard and a manufacturing method thereof.

BACKGROUND OF THE INVENTION

The existing display panels are obtained by cutting a display motherboard. The display motherboard is provided with cutting lines, which divide the display motherboard into a plurality of display panel units. After the display motherboard has been cut in accordance with the cutting lines, one display panel unit corresponds to one display panel. For production of large-sized display panels, a marker may be provided on each display panel unit when manufacturing the display motherboard, so as to distinguish each display panel. The marker occupies a space of 1 cm×10 cm, and it is different for each display panel unit on the display motherboard.

For production of small-sized display panels, the marker will occupy a relatively large space if the marking method for the production line of large-sized display panels is used to mark the small-sized display panels, so that design of peripheral area of the small-sized display panel becomes difficult. Moreover, one display motherboard may be cut to obtain several hundreds of small-sized display panels, marking all of the display panels one by one will consume a large amount of time, thereby affecting capacity of production line. For this reason, in consideration of the capacity of the production line, it is possible to not perform the marking on the small-sized display panels in the production. However, in a case where an issue occurs in subsequent processes, it is impossible to track previous processes. Therefore, how to mark the display panels in the production line of small-sized display panels becomes an issue having to be solved urgently.

SUMMARY OF THE INVENTION

In view of above problems, embodiments of the present invention provide a display motherboard and a manufacturing method thereof, which are used for solving the problem in the prior art that a large amount of time will be consumed to mark all display panels when manufacturing the display panels so that the capacity of the production line will be affected.

An embodiment of the present invention provides a manufacturing method of a display motherboard. The display motherboard includes a plurality of process areas, the process area including a plurality of display panels and the display panel including a color filter substrate and an array substrate provided opposite to each other;

the manufacturing method includes:

forming a display area and a non-display area on the color filter substrate, the non-display area being provided surrounding the display area, a part of the non-display area on one side of the display area being provided with a predetermined number of transitional sub-pixels, the predetermined number of transitional sub-pixels being used for identifying the process area corresponding to the display panel; and forming a location identifier on the array substrate, the location identifier being used for identifying the position of the display panel in the process area.

The predetermined numbers for the transitional sub-pixels corresponding to the color filter substrates in different process areas may be different; and the predetermined numbers for the transitional sub-pixels corresponding to the color filter substrates in the same process area may be identical.

The location identifiers corresponding to the array substrates at different positions in the same process area may be different; and the location identifiers corresponding to the array substrates at the same relative positions in different process areas may be identical.

A gate line may be formed on the array substrate concurrently with the formation of the location identifier on the array substrate.

A data line may be formed on the array substrate concurrently with the formation of the location identifier on the array substrate.

A pixel electrode may be formed on the array substrate concurrently with the formation of the location identifier on the array substrate.

An embodiment of the present invention further provides a display motherboard, which includes a plurality of process areas, the process area including a plurality of display panels and the display panel including a color filter substrate and an array substrate provided opposite to each other;

the color filter substrate includes a display area and a non-display area, the non-display area being provided surrounding the display area, a part of the non-display area on one side of the display area being provided with a predetermined number of transitional sub-pixels, the predetermined number of transitional sub-pixel being used for identifying the process area corresponding to the display panel; and the array substrate includes a location identifier, the location identifier being used for identifying the position of the display panel in the process area.

The predetermined numbers for the transitional sub-pixels corresponding to the color filter substrates in different process areas may be different; and the predetermined numbers for the transitional sub-pixels corresponding to the color filter substrates in the same process area may be identical.

The location identifiers corresponding to the array substrates at different positions in the same process area may be different; and the location identifiers corresponding to the array substrates at the same relative positions in different process areas may be identical.

A sealant is provided between the array substrate and the color filter substrate and the location identifier may be provided outside of the sealant.

The array substrate further includes a gate line and the location identifier may be provided in the same layer with the gate line.

The array substrate further includes a data line and the location identifier may be provided in the same layer with the data line.

The array substrate further includes a pixel electrode and the location identifier may be provided in the same layer with the pixel electrode.

A height of the transitional sub-pixel may be three times as large as a width of the transitional sub-pixel.

According to the display motherboard and the manufacturing method thereof provided by embodiments of the present invention, the display motherboard includes a plurality of process areas, the process area includes a plurality of display panels, and the display panel includes a color filter substrate and an array substrate provided opposite to each other. The technical solution of the present invention first determines the process area, to which the display panel belongs, by the predetermined number for the transitional sub-pixels in the part of the non-display area on one side of the display area on the color filter substrate, and then determines the specific position of the display panel in the process area, to which the display panel belongs, by the location identifier on the array substrate, so that the identification for the display panel is realized, which improves the capacity of the production line while optimizing the design space of the peripheral area for the display panel.

BRIEF DESCRIPTION OF THE DRAWINGS

FIGS. 6-11 are schematic diagrams illustrating distributions of transitional sub-pixels in various color filter substrates in Embodiment 1.

DETAILED DESCRIPTION OF THE EMBODIMENTS

To make those skilled in the art better understand the technical solutions of the present invention, the display motherboard and the manufacturing method thereof provided by the present invention will be described in details below in conjunction with the accompany drawings.

Embodiment 1

The principle of the present invention is that marking a display panel is realized by utilizing a location identifier on an array substrate and a predetermined number of transitional sub-pixels in a part of a non-display area on one side of a display area on a color filter substrate.

When identifying a display panel, the display panel to be identified may be placed under a high power microscope, and the process area, to which the display panel belongs, can be determined first by observing the predetermined number for the transitional sub-pixels in a part of the non-display area on one side of the display area on the color filter substrate, and then the specific position of the display panel in the process area, to which the display panel belongs, can be determined by observing the location identifier on the array substrate, which in turn determines the specific position of the display panel in the display motherboard.

Figure 1:
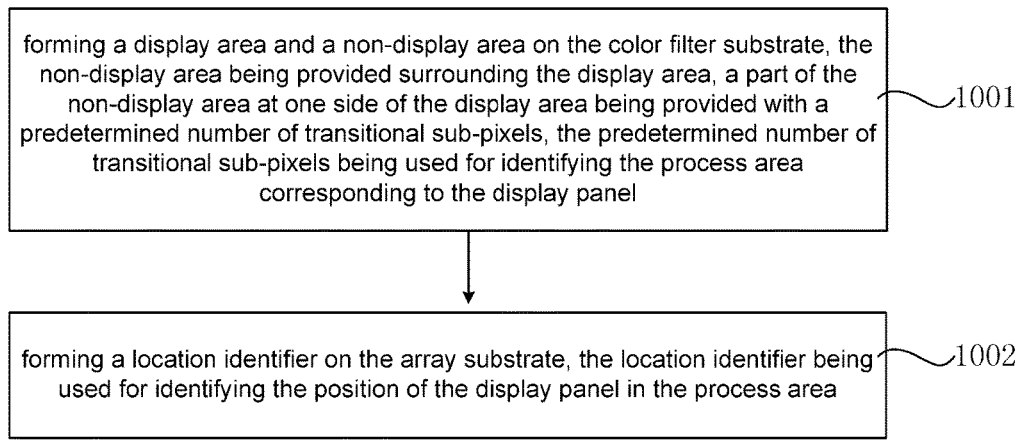
FIG. 1 is a flowchart of a manufacturing method of a display motherboard provided by Embodiment 1 of the present invention.

FIG. 1 is a flowchart of a manufacturing method of a display motherboard provided by Embodiment 1 of the present invention. The display motherboard includes a plurality of process areas, the process area includes a plurality of display panels, and the display panel includes a color filter substrate and an array substrate provided opposite to each other. The manufacturing method includes:

step 1001, forming a display area and a non-display area on the color filter substrate, the non-display area being provided surrounding the display area, a part of the non-display area on one side of the display area being provided with a predetermined number of transitional sub-pixels, the predetermined number of transitional sub-pixels being used for identifying the process area corresponding to the display panel; and step 1002, forming a location identifier on the array substrate, the location identifier being used for identifying the position of the display panel in the process area.

Figure 2:
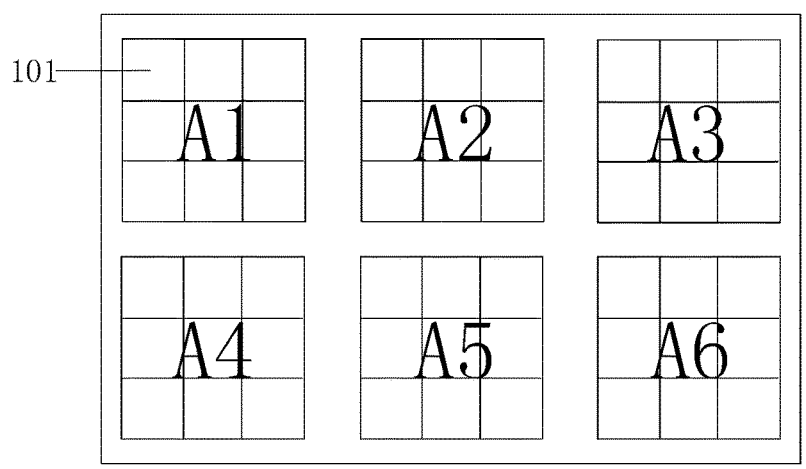
FIG. 2 is a schematic diagram illustrating distribution of different process areas on the display motherboard in Embodiment 1.
Figure 3:
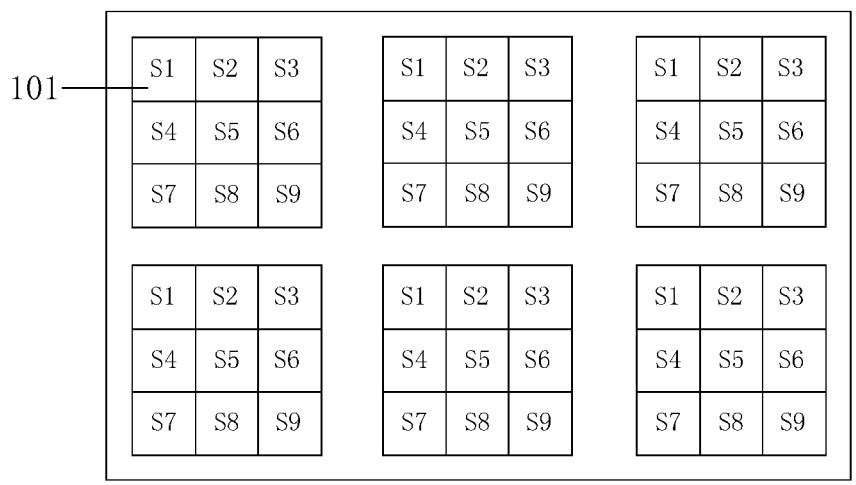
FIG. 3 is a schematic diagram illustrating distribution of different display panels on the display motherboard in Embodiment 1.

FIG. 2 is a schematic diagram illustrating distribution of different process areas on the display motherboard in Embodiment 1, and FIG. 3 is a schematic diagram illustrating distribution of different display panels on the display motherboard in Embodiment 1. As shown in FIG. 2 and FIG. 3, the display motherboard includes six process areas 101, i.e., A1, A2, A3, A4, A5 and A6, and each of the process areas 101 includes nine display panels, i.e., S1, S2, S3, S4, S5, S6, S7, S8 and S9. For example, the location identifier on the array substrate of the display panel S1 may be $S_1$, the location identifier on the array substrate of the display panel S2 may be $S_2$, the location identifier on the array substrate of the display panel S3 may be $S_3$, . . . , and the location identifier on the array substrate of the display panel S9 may be $S_9$. The location identifiers are provided on the array substrates in this manner, so that the location identifiers corresponding to the array substrates at different positions in the same process area are different, and the location identifiers corresponding to the array substrates at the same relative positions in different process areas are identical.

As the location identifiers corresponding to the array substrates at the same relative positions in different process areas are identical, when an exposing process is performed on the different process areas, it is possible to use the same location identifier mask to perform the exposing process. Meanwhile, as the pattern within each process area is the same, it is thus possible to perform patterning processes on all the process areas through repeating the operation, which improves the efficiency of the production line.

For example, a gate line may be formed on the array substrate concurrently with the formation of the location identifier on the array substrate, so that the location identifier is provided in the same layer with the gate line. For example, a data line may be formed on the array substrate concurrently with the formation of the location identifier on the array substrate, so that the location identifier is provided in the same layer with the data line. For example, a pixel electrode may be formed on the array substrate concurrently with the formation of the location identifier on the array substrate, so that the location identifier is provided in the same layer with the pixel electrode.

Figure 4:
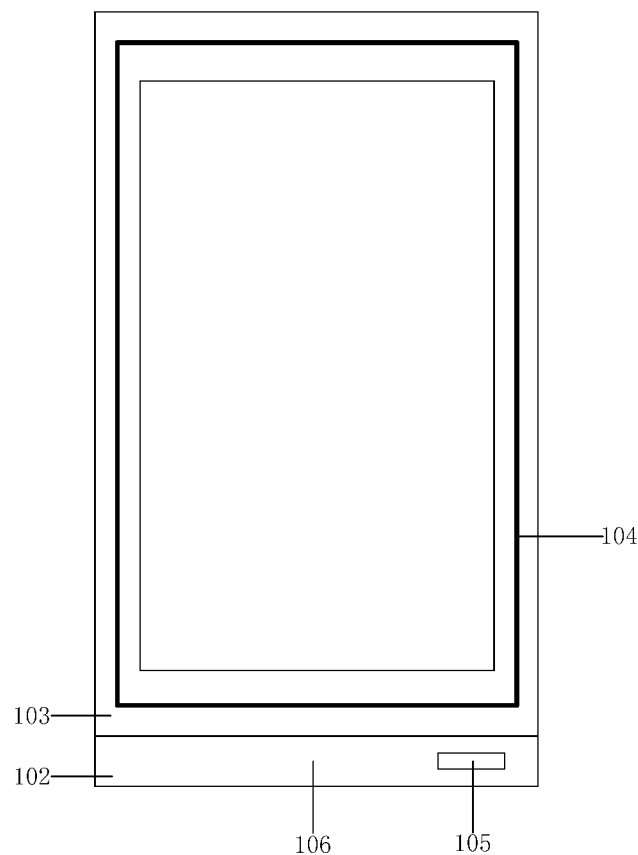
FIG. 4 is a structural diagram of the display panel in Embodiment 1.

FIG. 4 is a structural diagram of the display panel in Embodiment 1. As shown in FIG. 4, a sealant 104 is provided between an array substrate 102 and a color filter substrate 103, and a location identifier 105 is located outside of the sealant 104. In the display panel, an area outside of the sealant 104 will not perform display of pixels, and providing the location identifier 105 outside of the sealant 104 will not affect the display function of the display panel. Specifically, the location identifier 105 is located at an electrode end 106 of the array substrate 102.

Narrow frame is a trend in development of future display panel. Thus, when identifying all display panels of a display motherboard, not only the capacity of manufacturing has to be considered, but also the space in the peripheral area of the display panel that the identifier occupies has to be considered. In the prior art, an identifier occupies a space of 1 cm×10 cm. The location identifier 105 provided by the present embodiment is formed by a patterning process, and it is thus may be designed smaller. For example, the space occupied by the location identifier may be 1 cm×1 cm. Therefore, the design space of the peripheral area of the display panel can be optimized through the location identifier provided by the present embodiment, and it is suitable for the production line of small-sized display panels.

Figure 5:
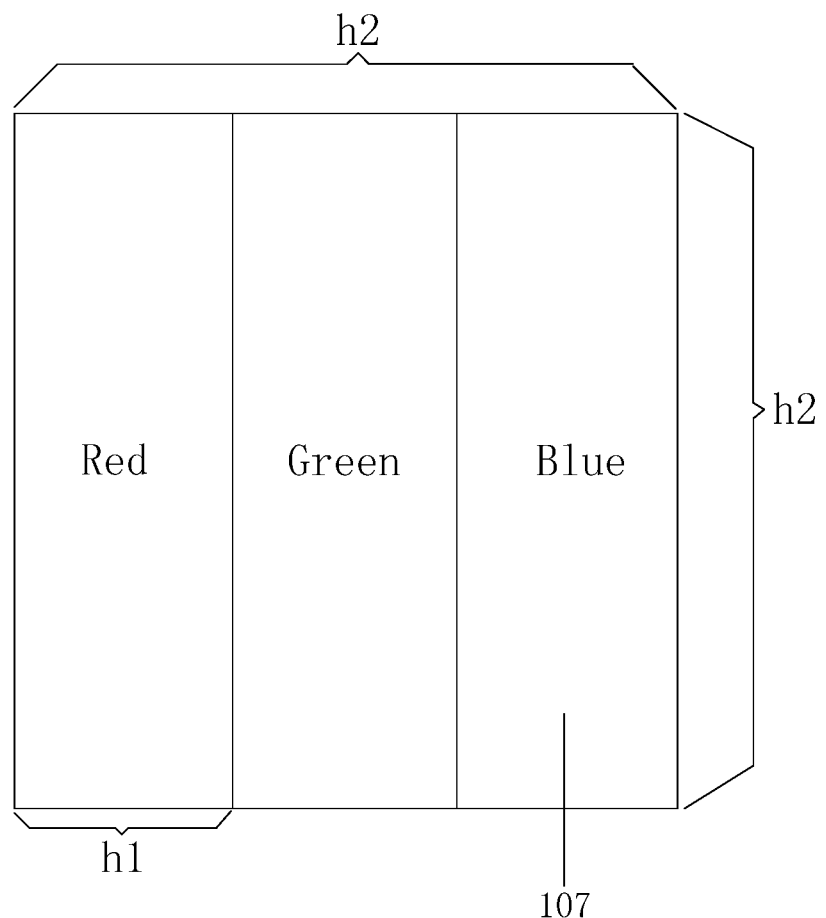
FIG. 5 is a structural diagram of a pixel in Embodiment 1.

FIG. 5 is a structural diagram of a pixel in Embodiment 1. As shown in FIG. 5, the pixel includes three sub-pixels 107 (e.g., a red sub-pixel, a green sub-pixel and a blue sub-pixel), a height (h2) of the sub-pixel 107 may be three times as large as a width (h1) of the sub-pixel. For example, the width of the sub-pixel may be ranged from 0.02 mm to 0.04 mm. The array substrate is formed by repeatedly arranging the pixels shown in FIG. 5.

Figure 6:
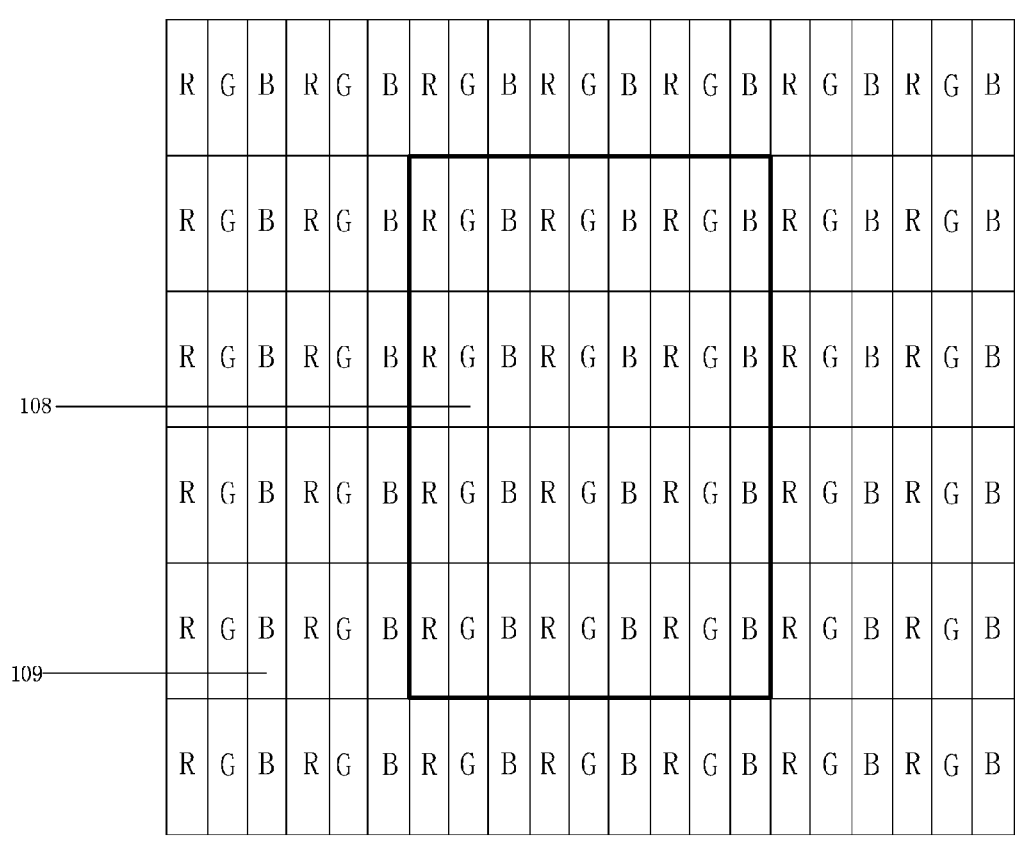

FIG. 6 to FIG. 11 is schematic diagrams illustrating distributions of sub-pixels in various color filter substrates in Embodiment 1. As shown in FIG. 6 to FIG. 11, the color filter substrate includes a display area 108 and a non-display area 109, and the non-display area 109 is provided surrounding the display area 108. In practical applications, a plurality rows or columns of sub-pixels (dummy RGBs) are generally provided in the non-display area 109 of the color filter substrate, and the function of the sub-pixels (dummy RGBs) is to ensure that the uniformity of the final display panel between a thickness of the non-display area 109 and a thickness of the display area 108. Thus, these sub-pixels (dummy RGBs) in the non-display area 109 can be called transitional sub-pixels. Referring to FIG. 6, there are respectively six columns of transitional sub-pixels on the left and right sides of the display area 108, and respectively one row of transitional sub-pixels on the upper and lower sides of the display area 108.

In the present embodiment, different process areas are distinguished by utilizing the predetermined numbers for the transitional sub-pixels in the non-display area 109 on one side of the display area 108 on the color filter substrate. Specifically, by translating a mask for forming sub-pixels, a predetermined number of transitional sub-pixels are formed in a part of the non-display area 109 on one side of the display area 108 in each process area, on a premise that the arrangement of the sub-pixels in the display area 108 is not affected. For example, the predetermined numbers for the transitional sub-pixels corresponding to the color filter substrates in different process areas are different, and the predetermined numbers for the transitional sub-pixels corresponding to the color filter substrates in the same process area are identical.

Referring to FIG. 7, the RGB sub-pixels on the color filter substrate are arranged one by one, and on basis of FIG. 6, by horizontally translating the RGB sub-pixels leftward by a distance of one sub-pixel (that is, by horizontally translating corresponding display area 108 leftward by a distance of one sub-pixel), the transitional sub-pixels on the left side of the display area 108 is reduced by one column, and the transitional sub-pixels on the right side of the display area 108 is increased by one column, and the arrangement of the sub-pixels in the display area 108 remains unchanged. The method for realizing the translation is horizontally translating masks for RGB sub-pixels leftward by a distance of one sub-pixel respectively when performing exposing for the RGB sub-pixels. In the same way, on basis of FIG. 6, by horizontally translating the RGB sub-pixels leftward or rightward, in the case that there are at least three columns of transitional sub-pixels on both sides of the display area 108, six different combinations as shown in FIG. 6 to FIG. 11 in total exist. At present, exposing by mask is generally four times exposing or six times exposing (i.e., dividing a display motherboard to be exposed into four or six areas, and performing exposing in the four or six areas respectively through a mask). Therefore, it is sufficiently to distinguish different process areas by the method of translating sub-pixels.

Figure 9:
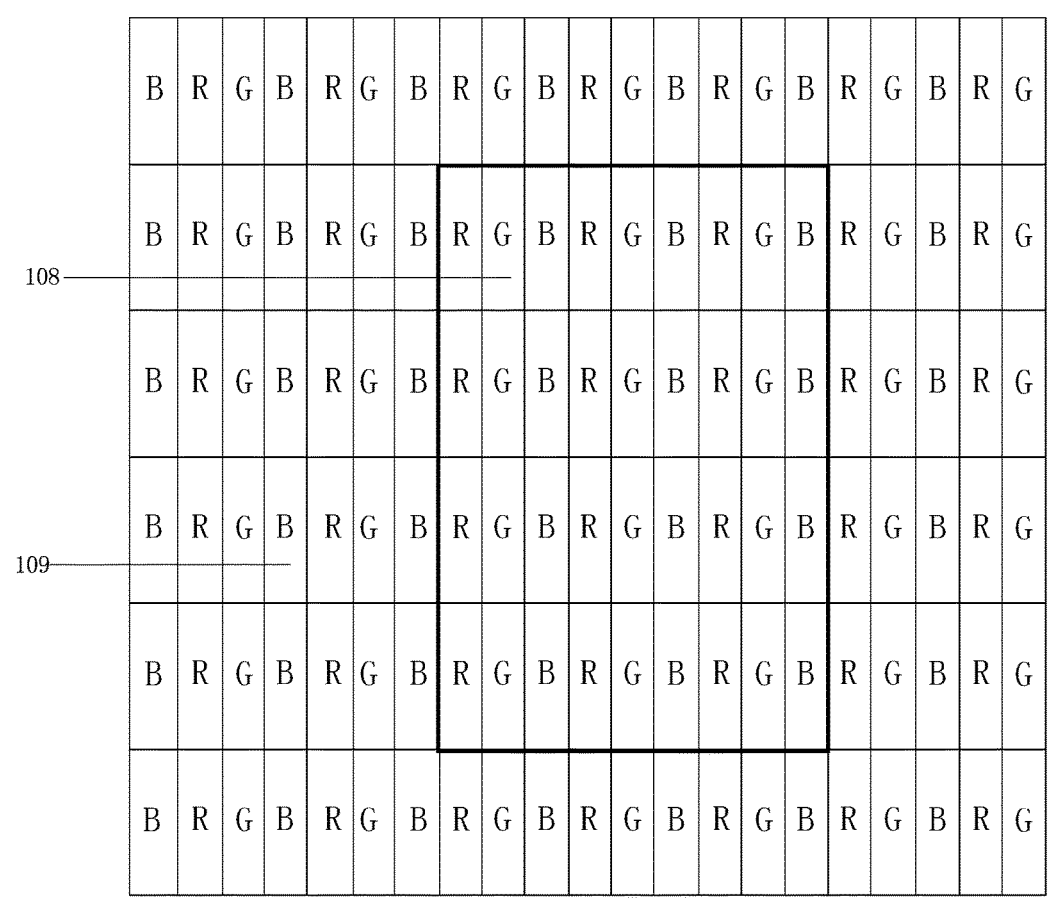
Figure 10:
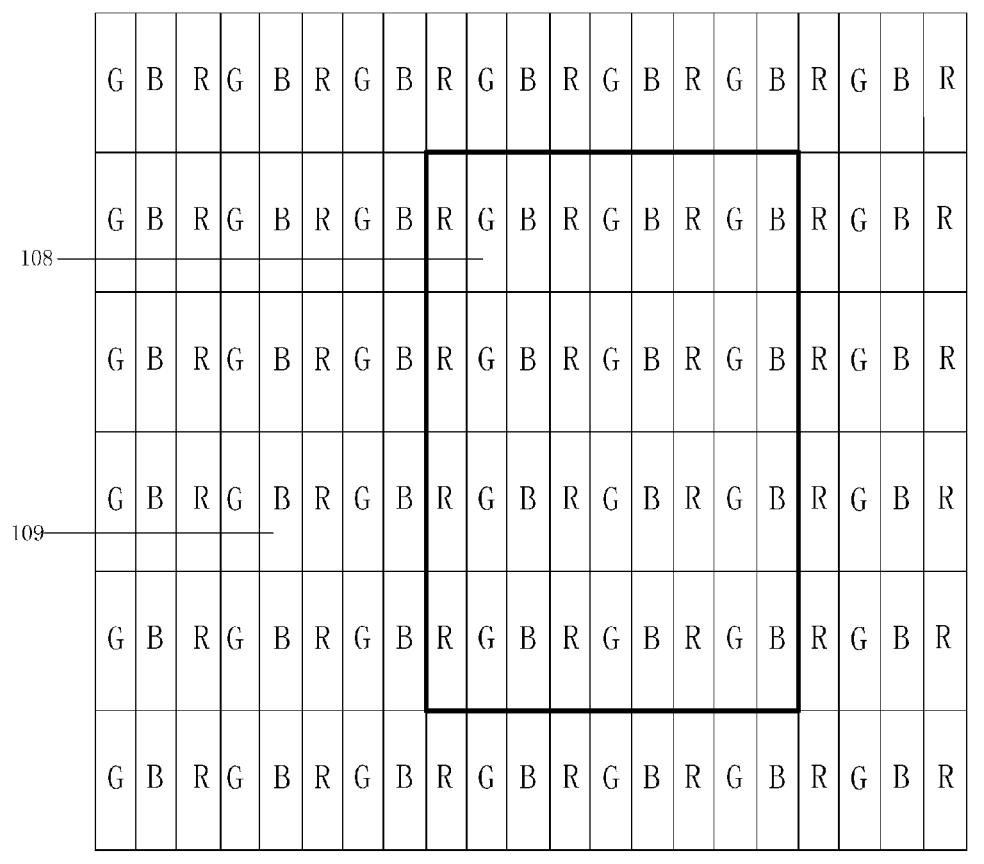
Figure 11:
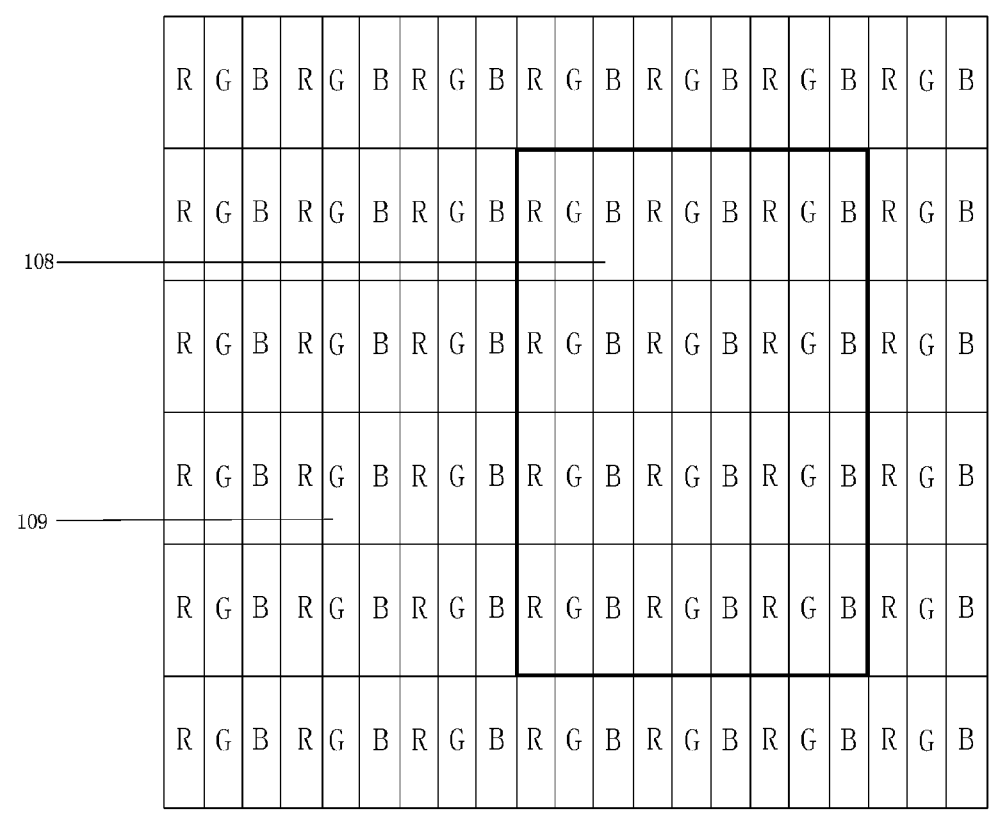

In the present embodiment, in FIG. 6, the predetermined number for the transitional sub-pixels on the left side of the display area 108 is 36, and the predetermined number for the transitional sub-pixels on the right side of the display area 108 is 36. In FIG. 7, the predetermined number for the transitional sub-pixels on the left side of the display area 108 is 30, and the predetermined number for the transitional sub-pixels on the right side of the display area 108 is 42. In FIG. 8, the predetermined number for the transitional sub-pixels on the left side of the display area 108 is 24, and the predetermined number for the transitional sub-pixels on the right side of the display area 108 is 48. In FIG. 9, the predetermined number for the transitional sub-pixels on the left side of the display area 108 is 42, and the predetermined number for the transitional sub-pixels on the right side of the display area 108 is 30. In FIG. 10, the predetermined number for the transitional sub-pixels on the left side of the display area 108 is 48, and the predetermined number for the transitional sub-pixels on the right side of the display area 108 is 24. In FIG. 11, the predetermined number for the transitional sub-pixels on the left side of the display area 108 is 54, and the predetermined number for the transitional sub-pixels on the right side of the display area 108 is 18. It can be seen that the predetermined numbers for the transitional sub-pixels on the left side of the display area 108 are 36, 30, 24, 42, 48 and 54, respectively, and the predetermined numbers for the transitional sub-pixels on the right side of the display area 108 are 36, 42, 48, 30, 24 and 18, respectively.

Therefore, in the present embodiment, it is possible to distinguish different process areas by the predetermined numbers for the transitional sub-pixels on the same side of the display area 108.

According to the manufacturing method provided by the present embodiment, the display motherboard includes a plurality of process areas, the process area includes a plurality of display panels, and the display panel includes a color filter substrate and an array substrate provided opposite to each other. The technical solution of the present embodiment first determines the process area, to which the display panel belongs, by the predetermined number for the transitional sub-pixels in the part of the non-display area on one side of the display area on the color filter substrate, and then determines the specific position of the display panel in the process area, to which the display panel belongs, by the location identifier on the array substrate, so that the identification for the display panel is realized, which improves the capacity of the production line while optimizing the design space of the peripheral area for the display panel.

Embodiment 2

The present embodiment provides a display motherboard, which includes a plurality of process areas. The process area includes a plurality of display panels, and the display panel includes a color filter substrate and an array substrate provided opposite to each other. The color filter substrate includes a display area and a non-display area, and the non-display area is provided surrounding the display area. A part of the non-display area on one side of the display area is provided with a predetermined number of transitional sub-pixels, and the predetermined number of transitional sub-pixels is used for identifying the process area corresponding to the display panel. The array substrate includes a location identifier, and the location identifier is used for identifying the position of the display panel in the process area.

Referring to FIG. 2 and FIG. 3, the display motherboard includes six process areas 101, i.e., A1, A2, A3, A4, A5 and A6, and each of the process areas 101 includes nine display panels, i.e., S1, S2, S3, S4, S5, S6, S7, S8 and S9. For example, the location identifier on the array substrate of the display panel S1 may be $S_1$, the location identifier on the array substrate of the display panel S2 may be $S_2$, the location identifier on the array substrate of the display panel S3 may be $S_3$, . . . , and the location identifier on the array substrate of the display panel S9 may be $S_9$. The location identifiers are provided on the array substrates in this manner, so that the location identifiers corresponding to the array substrates at different positions in the same process area are different, and the location identifiers corresponding to the array substrates at the same relative positions in different process areas are identical.

For example, the array substrate includes a gate line, a data line and a pixel electrode. The location identifier may be provided in the same layer with the gate line, or the location identifier may be provided in the same layer with the data line, or the location identifier may be provided in the same layer with the pixel electrode. Taking the location identifier is provided in the same layer with the gate line as an example, the existing mask for gate lines may be modified, such that the mask for gate lines and the mask for the location identifier are combined as one mask, that is, the location identifier is formed concurrently with the formation of gate lines. Thus, during the process of forming the location identifier in the present embodiment, it is not necessary to add separate mask for location identifier and separate process in the production line, such that the efficiency of the production line is ensured.

Referring to FIG. 4, a sealant 104 is formed between an array substrate 102 and a color filter substrate 103, and a location identifier 105 is located outside of the sealant 104. In the display panel, an area outside of the sealant 104 will not perform display of pixels, and providing the location identifier 105 outside of the sealant 104 will not affect the display function of the display panel. Specifically, the location identifier 105 is located at an electrode end 106 of the array substrate 102.

In the present embodiment, different process areas are distinguished by utilizing the predetermined number for the transitional sub-pixels in the part of the non-display area on one side of the display area on the color filter substrate. Regarding the predetermined number for the transitional sub-pixels and how to form the predetermined number of transitional sub-pixels, details thereof can refer to the above Embodiment 1, and will not be described herein.

According to the display motherboard provided by the present embodiment, the display motherboard includes a plurality of process areas, the process area includes a plurality of display panels, and the display panel includes a color filter substrate and an array substrate provided opposite to each other. The technical solution of the present embodiment first determines the process area, to which the display panel belongs, by the predetermined number for the transitional sub-pixels in the part of the non-display area on one side of the display area on the color filter substrate, and then determines the specific position of the display panel in the process area, to which the display panel belongs, by the location identifier on the array substrate, so that the identification for the display panel is realized, which improves the capacity of the production line while optimizing the design space of the peripheral area for the display panel.

It can be understood that the foregoing implementations are merely the exemplary embodiments used for explaining the principle of the present invention, but the present invention is not limited thereto. Various modifications and improvements can be made by those skilled in the art without departing from the spirit and essence of the present invention, and these modifications and improvements shall also fall within the protection scope of the present invention.

What is claimed is:

1. A manufacturing method of a display motherboard, which includes a plurality of process areas, the process area including a plurality of display panels and the display panel including a color filter substrate and an array substrate provided opposite to each other;

the manufacturing method includes:

forming a display area and a non-display area on the color filter substrate, the non-display area being provided surrounding the display area, a part of the non-display area on one side of the display area being provided with a predetermined number of transitional sub-pixels, the predetermined number of transitional sub-pixels being used for identifying the process area corresponding to the display panel; and forming a location identifier on the array substrate, the location identifier being used for identifying the position of the display panel in the process area.

2. The manufacturing method of the display motherboard according to claim 1, wherein the predetermined numbers for the transitional sub-pixels corresponding to the color filter substrates in different process areas are different; and the predetermined numbers for the transitional sub-pixels corresponding to the color filter substrates in the same process area are identical.

3. The manufacturing method of the display motherboard according to claim 1, wherein the location identifiers corresponding to the array substrates at different positions in the same process area are different; and the location identifiers corresponding to the array substrates at the same relative positions in different process areas are identical.

4. The manufacturing method of the display motherboard according to claim 1, wherein a gate line is formed on the array substrate concurrently with the formation of the location identifier on the array substrate.

5. The manufacturing method of the display motherboard according to claim 1, wherein a data line is formed on the array substrate concurrently with the formation of the location identifier on the array substrate.

6. The manufacturing method of the display motherboard according to claim 1, wherein a pixel electrode is formed on the array substrate concurrently with the formation of the location identifier on the array substrate.

7. A display motherboard, which includes a plurality of process areas, the process area including a plurality of display panels and the display panel including a color filter substrate and an array substrate provided opposite to each other;

the color filter substrate includes a display area and a non-display area, the non-display area being provided surrounding the display area, a part of the non-display area on one side of the display area being provided with a predetermined number of transitional sub-pixels, the predetermined number of transitional sub-pixel being used for identifying the process area corresponding to the display panel; and the array substrate includes a location identifier, the location identifier being used for identifying the position of the display panel in the process area.

8. The display motherboard according to claim 7, wherein the predetermined numbers for the transitional sub-pixels corresponding to the color filter substrates in different process areas are different; and the predetermined numbers for the transitional sub-pixels corresponding to the color filter substrates in the same process area are identical.

9. The display motherboard according to claim 7, wherein the location identifiers corresponding to the array substrates at different positions in the same process area are different; and the location identifiers corresponding to the array substrates at the same relative positions in different process areas are identical.

10. The display motherboard according to claim 7, wherein a sealant is provided between the array substrate and the color filter substrate and the location identifier is provided outside of the sealant.

11. The display motherboard according to claim 7, wherein the array substrate further includes a gate line and the location identifier is provided in the same layer with the gate line.

12. The display motherboard according to claim 7, wherein the array substrate further includes a data line and the location identifier is provided in the same layer with the data line.

13. The display motherboard according to claim 7, wherein the array substrate further includes a pixel electrode and the location identifier is provided in the same layer with the pixel electrode.

14. The display motherboard according to claim 7, wherein a height of the transitional sub-pixel is three times as large as a width of the transitional sub-pixel.

* * * * *